United States Patent
Bet-Shliemoun

(10) Patent No.: US 8,407,888 B2
(45) Date of Patent: Apr. 2, 2013

(54) METHOD OF ASSEMBLING A CIRCUIT BOARD ASSEMBLY

(75) Inventor: Ashur S. Bet-Shliemoun, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 293 days.

(21) Appl. No.: 12/776,027

(22) Filed: May 7, 2010

(65) Prior Publication Data
US 2011/0273857 A1 Nov. 10, 2011

(51) Int. Cl.
*H05K 3/36* (2006.01)
(52) U.S. Cl. .............. 29/830; 29/840; 29/842; 29/845; 228/180.22; 439/66
(58) Field of Classification Search .............. 29/830, 29/840, 842, 845; 228/180.22; 439/66
See application file for complete search history.

(56) References Cited

U.S. PATENT DOCUMENTS

| | | | | |
|---|---|---|---|---|
| 3,795,037 | A * | 3/1974 | Luttmer | 29/883 |
| 5,476,211 | A | 12/1995 | Khandros | |
| 5,531,022 | A * | 7/1996 | Beaman et al. | 29/850 |
| 5,794,330 | A * | 8/1998 | Distefano et al. | 29/840 |
| 5,806,181 | A * | 9/1998 | Khandros et al. | 29/874 |
| 5,917,707 | A | 6/1999 | Khandros et al. | |
| 6,091,137 | A | 7/2000 | Fukuda | |
| 6,250,933 | B1 | 6/2001 | Khoury et al. | |
| 6,268,662 | B1 * | 7/2001 | Test et al. | 257/784 |
| 6,336,269 | B1 | 1/2002 | Eldridge et al. | |
| 6,362,520 | B2 | 3/2002 | DiStefano | |
| 6,524,892 | B1 | 2/2003 | Kishimoto et al. | |
| 6,528,349 | B1 | 3/2003 | Patel et al. | |
| 6,552,419 | B2 | 4/2003 | Toyosawa | |
| 6,709,895 | B1 | 3/2004 | Distefano | |
| 6,717,421 | B1 * | 4/2004 | Kazama | 324/754.07 |
| 6,778,406 | B2 | 8/2004 | Grube et al. | |
| 6,905,961 | B2 * | 6/2005 | Caletka et al. | 438/667 |
| 6,953,707 | B2 | 10/2005 | Variyam | |
| 7,244,125 | B2 | 7/2007 | Brown et al. | |
| 7,304,376 | B2 * | 12/2007 | Haba et al. | 257/696 |
| 7,432,202 | B2 | 10/2008 | Saha et al. | |
| 7,758,351 | B2 | 7/2010 | Brown et al. | |
| 7,989,945 | B2 | 8/2011 | Williams et al. | |
| 2001/0020545 | A1 | 9/2001 | Eldridge et al. | |
| 2001/0027007 | A1 | 10/2001 | Hosomi et al. | |
| 2002/0056922 | A1 | 5/2002 | Funaya et al. | |
| 2003/0102160 | A1 | 6/2003 | Gaudiello et al. | |
| 2007/0108627 | A1 | 5/2007 | Kozaka et al. | |
| 2009/0302456 | A1 | 12/2009 | Oikawa et al. | |

FOREIGN PATENT DOCUMENTS
WO 9514314 A1 5/1995

OTHER PUBLICATIONS
U.S. Office Action for U.S. Appl. No. 12/132,716, mailed Dec. 13, 2010, 10 pages.

* cited by examiner

*Primary Examiner* — Carl Arbes
(74) *Attorney, Agent, or Firm* — Brooks Kushman P.C.

(57) ABSTRACT

A method for manufacturing a silicon chip package for a circuit board assembly is provided with a package substrate having a silicon chip and an array of contact pads provided by conductive material. A plurality of conductive springs are affixed to the array of contact pads for providing conductive contact with the corresponding array of contacts on a circuit board assembly.

12 Claims, 2 Drawing Sheets

US 8,407,888 B2

METHOD OF ASSEMBLING A CIRCUIT BOARD ASSEMBLY

TECHNICAL FIELD

Embodiments of the invention relate to contact pads for silicon chip packages for attachment to circuit boards.

BACKGROUND

The prior art provides circuit board assemblies with components attached thereto, including silicon chip packages. The packages enclose a silicon chip in an organic or ceramic material. The circuit board assemblies often include an array of contact pads for engaging a ball grid array upon the package. The circuit board assemblies often also include a land grid array socket for receiving a series of pins on the package.

SUMMARY

At least one embodiment provides a method for manufacturing a silicon chip package for a circuit board assembly by providing a package substrate with a silicon chip and an array of contact pads provided by a conductive material. A plurality of conductive springs are affixed to the array of contact pads for providing conductive contact with a corresponding array of contacts on a circuit board assembly.

In at least one embodiment, a method for assembling a circuit board assembly provides a printed circuit board with an array of contact pads corresponding to the array of contact pads on a silicon chip package that has a plurality of conductive springs. The silicon chip package is assembled to the printed circuit board such that the plurality of springs are in conductive contact with the array of contact pads on the printed circuit board.

At least one embodiment provides a silicon chip package for a circuit board assembly having a package substrate with a silicon chip. An array of contact pads on the package substrate are provided by a conductive material. A plurality of conductive springs are affixed to the array of contact pads for providing conductive contact with a corresponding array of contacts on a circuit board assembly.

At least one embodiment provides a circuit board assembly with a printed circuit board having an array of contact pads. A silicon chip package has a package substrate with a silicon chip. The substrate is received by the printed circuit board. An array of contact pads are provided on the package substrate from a conductive material. The array of contact pads on the package substrate correspond to the array of contact pads on the printed circuit board. A plurality of conductive springs are affixed to the array of contact pads on the substrate and are in conductive contact with the array of contact pads on the printed circuit board.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

Figure 1:
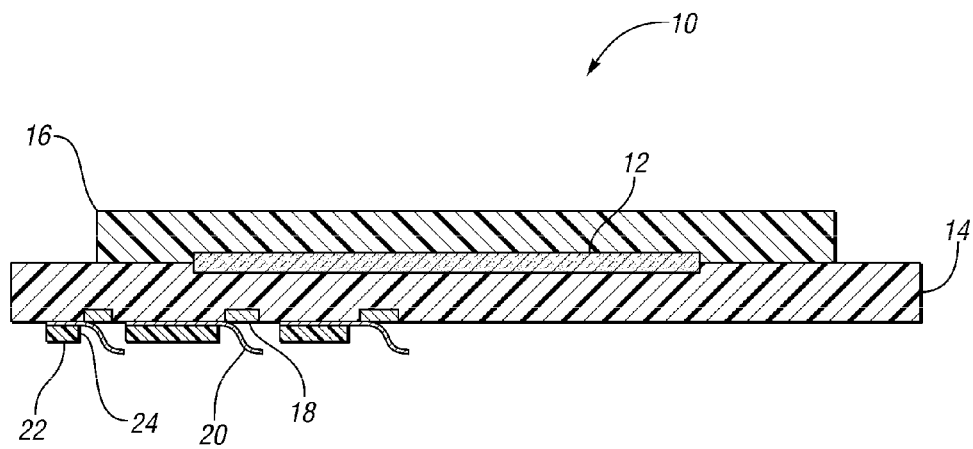
FIG. 1 is a side schematic view of a silicon chip package according to an embodiment.

Referring now to FIG. 1, a silicon chip package is illustrated according to an embodiment and is referenced generally by numeral 10. The package 10 includes a silicon chip 12 that is enclosed within a body of the package 10. The body may be provided, for example, by a substrate 14 and a lid 16. The lid 16 is illustrated for an example of an embodiment. At least one embodiment provides the body without a lid 16. In at least one embodiment, the substrate 14 is over-molded over the silicon chip 12.

The attachment of the silicon chip to the body of the package 10 is referred to as first level interconnect for attaching the chip 12 to the circuit board assembly. The lid 16 conceals the chip 12 upon the substrate 14. Subsequently, the silicon package 10 is assembled to a printed circuit board, which is often referred to as second level interconnect.

The second level interconnect of the prior art offers various challenges. For example, utilization of a ball grid array may result in cracking due to varying coefficients of thermal expansion during assembly or disassembly. Once the ball grid array is heated and bonds the package to the print circuit board, there is very little flexibility for adding or removing the central processing unit during system or circuit board assembly and manufacturing. Preconditioning of the ball grid array can add stress to the silicon. Dielectric materials are fragile and such occurrences may result in component failure.

Another prior art method for second level interconnect utilizes a land grid array with pins and sockets. Pins and sockets are very costly and require loading during assembly. The loading creates stress on the package and on the silicon of approximately 300 to 400 pounds of force. The loading may also result in component failure.

The second level interconnect provided by the depicted embodiment avoids the conditions that create the failures associated with the second level interconnect of the prior art.

The substrate 14 includes an array of conductive contact pads 18, each in electrical communication with the chip 12. The contact pads 18 may be arranged in a conventional land grid array without sockets. The array of contact pads 18 are oriented to align with a corresponding array of contact pads on a circuit board. A plurality of conductive springs 20 are each affixed on one of the contact pads 18 for contacting the associated contact pad on the circuit board for providing electrical communication therebetween. The material of the springs 20 may be similar to conventional land grid array socket springs and may be provided by a Beryllium Copper alloy, a Copper Nickel alloy, or the like. The springs 20 may be brazed or soldered to the contact pad 18. Of course any suitable fastening method is contemplated for affixing the springs 20 to the contact pads 18. Likewise, any suitable material may be employed for the springs 20. The contact springs 20 are illustrated with a suitable curved shape according to one embodiment. Of course various embodiments are contemplated with contact springs 20 having various shapes and forms.

The contact springs 20 provide a flexible conductive contact between the pads 18 of the silicon chip package 10 and the corresponding pads on the printed circuit board. The springs 20 provide compliancy and overcome difficulties associated with varying coefficients of thermal expansion (CTE). Reliability testing is requiring more stringent reliability test results than are available with prior art second level interconnects. For example, reliability testing by cycling temperatures from twenty degrees Celsius to one hundred degrees Celsius for 5,000 cycles, will only permit two shutdowns per day. The second level interconnect provided by the contact springs 20 greatly reduces failures by accommodating CTE mismatch and therefore withstanding the temperature cycling.

The contact springs 20 have an elastic range of compression. To avoid overloading of the springs 20, a dielectric sheet 22 is laminated upon the substrate 14. The dielectric sheet 22 includes a plurality of apertures 24 formed therein providing cavities for each of the springs 20. The dielectric sheet 22 has a thickness that is sized so that the springs 20 extend out of the apertures 24 for engagement with the corresponding circuit board. The thickness of the dielectric sheet 22 is also sized to permit compression of the contact springs 20 within the elastic range, while providing a limited compression to avoid loading in the plastic range of the springs 20, also known as overdriving. Although a dielectric sheet 22 is described, any suitable layer for preventing overloading of the springs 20 is contemplated by various embodiments. Additionally, the sheet 22 may be affixed by any suitable manner or in any suitable form, besides laminating. The contact springs 20 may each be plated with gold for contact with the corresponding array of contacts on the circuit board.

Figure 2:
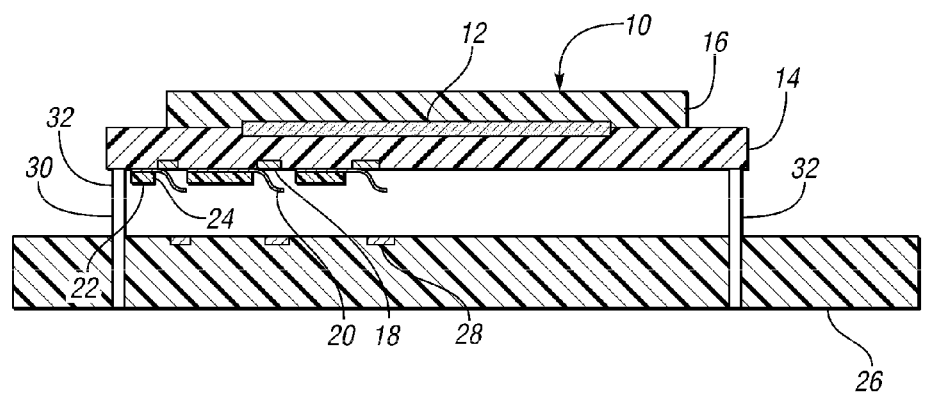
FIG. 2 is a side schematic view of the silicon chip package of FIG. 1 and a printed circuit board, illustrated in a position during assembly.

Referring now to FIG. 2, the silicon chip package 10 is illustrated with a printed circuit board 26 (PCB). The printed circuit board 26 includes an array of contact pads 28 that are aligned with the contact pads 18 of the substrate 14. The contact pads 28 of the PCB 26 may be arranged similar to a conventional land grid array without a socket. The PCB 26 may also include a plurality of alignment pins 30 for being received within apertures 32 in the substrate 14 of the silicon chip package 10. The pins 30 guide the package 10 during assembly and provide alignment for the contact pads 18, 28 of the substrate 14 and the PCB 26. In at least one embodiment, a frame is provided for supporting the pins 30 and for guiding the package 10 during assembly with the PCB 26.

In at least one embodiment, a heat sink (not shown) is provided over the package 10 for dissipating power from the package 10 to avoid overheating.

Figure 3:
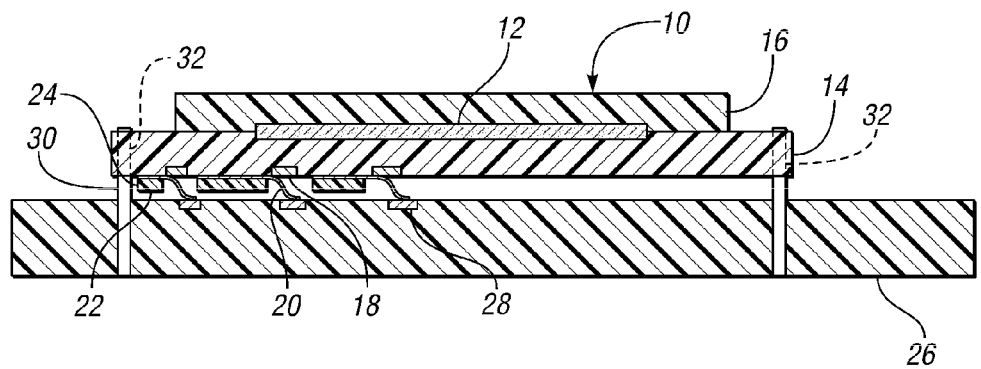
FIG. 3 is a schematic view of the silicon chip package and printed circuit board of FIG. 2, illustrated assembled.

In FIG. 3, the package 10 is pressed upon the PCB 26 until the springs 20 engage the PCB contact pads 28, and subsequently until the dielectric sheet 22 engages the PCB 26. The package 10 may be fastened to the PCB 26. The contact springs 20 may be soldered, brazed or otherwise attached to the contact pads 28 of the PCB 26.

Once assembled, the second level interconnect provided by the springs 20 provides compliancy while maintaining the contact for avoiding failures associated with the prior art second level interconnects. For example, the springs 20 can withstand flip chip re-flow in the assembly environment. The springs 20 may be protected during assembly, for packaging, and the like by the cavities 24 and the dielectric sheet 22. The springs 20 providing the second level interconnect avoid requirements for a socket for the second level interconnect, eliminate the requirement of a socket for burn-in; and eliminate the requirements for a socket for final testing. The compliancy of the springs 20 also minimizes stress to the first level interconnect.

Figure 4:
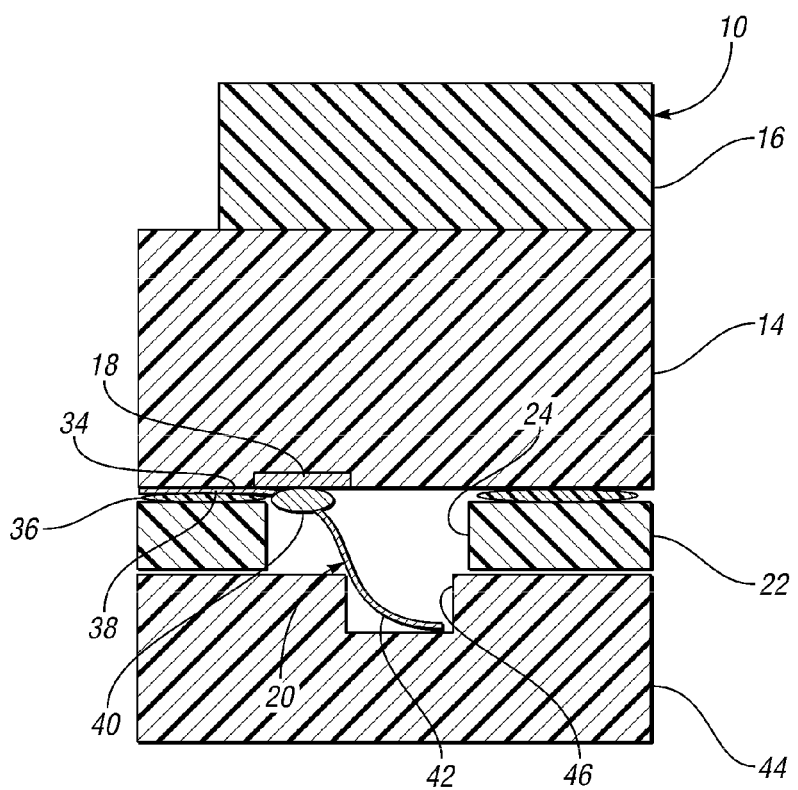
FIG. 4 is a side schematic view of the printed circuit board of FIG. 1.

Referring now to FIG. 4, the dielectric sheet 22 provides the cavities 24 for the springs 20 and they may also be utilized for aligning the springs 20. For example, the springs 20 may be provided with a mounting portion 34 that extends along the substrate 14. The dielectric sheet 22 may overlap the mounting portion 34 for securing the spring 20 to the substrate 14. An adhesive 36 may be provided between the dielectric sheet 22 and the substrate 14 for securing the dielectric sheet 22 and the springs 20 to the substrate 14.

An intermediate portion 38 on the spring 20 may extend along the contact pad 18 of the substrate 14 for contact with the contact pad 18. Solder 40, or any suitable adherent, may be provided on the intermediate portion 38 for subsequently soldering or brazing the intermediate portion 38 of the spring 20 to the substrate contact pad 18. An extension portion 42 extends through the cavity 24 for engaging a contact pad 28 on the associated printed circuit board 26.

For packaging and assembly of the silicon chip package 10, a carrier 44 may be provided for receiving the silicon chip package 10 thereon. The carrier 44 includes a cavity 46 for receiving the extension portion 42 of the contact springs 20 for holding and aligning the springs 20 during lamination to the substrate 14, during soldering or brazing of the springs 20 to the contact pad 18, or for protecting the spring 20 during these processes and/or packaging, shipping or assembly.

Although certain examples for attaching the springs 20 are illustrated and described, various methods and mechanisms can be employed such as the sheet 22 with cavities 24; a carrier 44 with cavities 46; a frame; and/or any other fixturing for individual or batch second level interconnecting of packages 10 to PCBs 26.

While various embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed:

1. A method for assembling a circuit board assembly comprising steps of:
    providing a package substrate with a silicon chip and an array of contact pads provided by a conductive material;
    affixing a plurality of conductive springs to the array of contact pads for providing conductive contact with a corresponding array of contacts on a circuit board assembly;
    providing a printed circuit board with an array of contact pads corresponding to the array of contact pads on the silicon chip package;
    assembling the silicon chip package to the printed circuit board such that the plurality of springs are in conductive contact with the array of contact pads on the printed circuit board;
    providing the printed circuit board with one of a plurality of pins and apertures;
    providing the package with the other of a plurality of pins and apertures; and
    inserting the pins into the apertures while assembling the package to the printed circuit board to align the springs with the array of contacts of the printed circuit board.

2. The method of claim 1 further comprising a step of brazing the plurality of conductive springs to the array of contact pads.

3. The method of claim 1 further comprising steps of:
    providing an array of cavities in the package substrate;
    providing the array of contact pads within the array of cavities; and providing the plurality of springs at least partially in the array of cavities for extending out of the cavities for protection of the plurality of springs during handling and assembly.

4. The method of claim 1 further comprising steps of:
providing at least one cavity in the package substrate;
providing the array of contact pads within the at least one cavity; and
providing the plurality of springs at least partially in the at least one cavity for extending out of the at least one cavity for protection of the plurality of springs during handling and assembly.

5. The method of claim 4 further comprising a step of sizing the plurality of springs and the at least one cavity so that each of the plurality of springs extends from the at least one cavity a distance corresponding to a range of compression for the springs.

6. The method of claim 1 further comprising a step of plating the plurality of conductive springs with gold for contact with the corresponding array of contacts on the circuit board assembly.

7. The method of claim 1 further comprising a step of providing the package substrate from a ceramic material.

8. The method of claim 1 further comprising a step of providing the package substrate with an organic material.

9. The method of claim 1 further comprising steps of:
providing a dielectric sheet with an array of apertures formed therethrough aligned with the array of contact pads of the package substrate; and
laminating the dielectric sheet to the package substrate with a portion of each spring therebetween for affixing the springs to the package substrate, and so that the apertures each form a cavity for at least partially concealing one of the plurality of springs for protection of the plurality of springs during handling and assembly.

10. The method of claim 1 further comprising a step of pressing the package to the printed circuit board for compressing the springs.

11. The method of claim 1 further comprising a step of soldering the plurality of springs to the contact pads of the printed circuit board.

12. The method of claim 1 further comprising aligning the plurality of springs in an array according to the array of contact pads as a spring grid array.

\* \* \* \* \*

UNITED STATES PATENT AND TRADEMARK OFFICE
CERTIFICATE OF CORRECTION

PATENT NO. : 8,407,888 B2  
APPLICATION NO. : 12/776027  
DATED : April 2, 2013  
INVENTOR(S) : Bet-Shliemoun Page 1 of 1

It is certified that error appears in the above-identified patent and that said Letters Patent is hereby corrected as shown below:

On Title page, in column 2, under U.S. Patent Documents, line 7, delete "Grube et al." and insert -- Eldridge et al. --, therefor.

Signed and Sealed this  
Ninth Day of July, 2013

Teresa Stanek Rea  
*Acting Director of the United States Patent and Trademark Office*